US006552904B2

(12) United States Patent
Fung

(10) Patent No.: US 6,552,904 B2
(45) Date of Patent: Apr. 22, 2003

(54) POWER TOOL WITH HEAT SINK ASSEMBLY

(75) Inventor: George CH Fung, Tseung Kwan O (HK)

(73) Assignee: Black & Decker Inc., Newark, DE (US)

( * ) Notice: Subject to any disclaimer, the term of this patent is extended or adjusted under 35 U.S.C. 154(b) by 0 days.

(21) Appl. No.: 09/928,849

(22) Filed: Aug. 13, 2001

(65) Prior Publication Data

US 2003/0030984 A1 Feb. 13, 2003

(51) Int. Cl.[7] .................................................. H05K 7/20

(52) U.S. Cl. ....................... 361/704; 361/707; 361/709; 165/80.2; 165/80.3; 165/185; 174/16.3; 310/50; 310/52; 310/53; 173/217

(58) Field of Search ................................ 361/704, 707, 361/709, 710, 717–720; 174/16.1, 16.3; 165/80.2, 80.3, 80.4, 185, 104.33; 310/50, 52, 53; 173/217

(56) References Cited

U.S. PATENT DOCUMENTS

| | | | | | |
|---|---|---|---|---|---|
| 4,179,644 A | | 12/1979 | Vassos | | |
| 4,314,170 A | * | 2/1982 | Sahrbacker | | 310/68 R |
| 4,937,705 A | | 6/1990 | Piber | | |
| 5,191,512 A | * | 3/1993 | Ogura et al. | | 361/704 |
| 5,200,657 A | | 4/1993 | Prestel | | |
| 5,289,047 A | | 2/1994 | Broghammer | | |
| 5,553,675 A | * | 9/1996 | Pitzen et al. | | 173/217 |
| 5,798,584 A | | 8/1998 | Schaeffeler et al. | | |
| 5,835,351 A | * | 11/1998 | Ulanski et al. | | 361/704 |
| 6,043,575 A | * | 3/2000 | Ghode et al. | | 310/52 |
| 6,049,460 A | | 4/2000 | Lin | | |
| 6,296,427 B1 | * | 10/2001 | Potter et al. | | 408/124 |

FOREIGN PATENT DOCUMENTS

| | | |
|---|---|---|
| DE | 30 07 833 C2 | 6/1985 |
| DE | 40 38 786 C2 | 6/1993 |
| DE | 195 08 925 | 9/1996 |
| DE | 198 31 458 A1 | 1/1999 |
| EP | 0 512 316 B1 | 4/1992 |

* cited by examiner

*Primary Examiner*—Boris Chervinsky
(74) *Attorney, Agent, or Firm*—Harness, Dickey & Pierce, P.L.C.

(57) ABSTRACT

A power tool such as a drill has an activation switch which energizes a motor which, in turn, drives an output. The switch includes a field effect transistor coupled to a heat sink to dissipate heat from the transistor. The heat sink is positioned at a free end of the handle remote from the switch.

11 Claims, 3 Drawing Sheets

POWER TOOL WITH HEAT SINK ASSEMBLY

FIELD AND BACKGROUND OF THE INVENTION

The present invention relates to power tools and, more specifically, to heat sinks in power tools for dissipating heat from the activation switch.

Variable speed cordless drills have included heat sinks to dissipate heat from the activation switch mechanism. These drills have included heat sinks which have been directly coupled with the switch assembly to dissipate the heat generated in the switch assembly. Also, the tools have included heat sinks positioned behind or adjacent to the drill motor. These heat sink mounting locations require the tool housing to be large enough to accommodate the bulk or size of the heat sinks. Thus, housings have tended to be larger to accommodate the heat sink. Further, the handle portions have been relatively large so that heat sinks could be mounted with the activation switch assembly.

The present invention provides the art with a heat sink assembly which enables the housing size to be reduced. Also, the present invention provides a heat sink which is positioned in the handle portion adjacent to the battery and remote from the switch. Also, the heat sink is positioned adjacent vents which provide cooling of the heat sink to enable better heat transfer.

SUMMARY OF THE INVENTION

In accordance with a first aspect of the invention, a power tool comprises a housing with the housing having a motor portion and a handle portion. A motor as well as an output coupled with the motor are positioned in the housing. An activation member is coupled with the motor to energize the motor to drive the output. A power source is coupled with the motor and the activation member. A heat sink is coupled with the activation member. The heat sink is positioned in the handle portion of the housing adjacent a free end of the handle portion. The power source is ordinarily a battery. A field effect transistor is coupled with the heat sink and the activation member to dissipate heat to the heat sink.

In accordance with a second aspect of the invention, a power tool comprises a housing having a motor portion and a handle portion. A motor is mounted in the housing. An output is coupled with the motor. An activation member in the housing is coupled with the motor to energize the motor to drive the output. A battery is coupled with the motor and activation member. The battery is supported on the housing adjacent the handle portion. A heat sink is coupled with the activation member. The heat sink is positioned in the handle portion adjacent the battery. The activation member is ordinarily a switch. A field effect transistor is coupled with the heat sink and dissipates heat to the heat sink. The handle portion includes rails on its free end to receive the battery. The heat sink has an overall trapezoidal shape. The housing handle portion includes a shelf to receive the heat sink. Also, the handle portion includes vents adjacent the heat sink to enable passage of fresh air into and past the heat sink. The heat sink is positioned remote from the switch.

From the following detailed description, taken in conjunction with the drawings and subjoined claims, other objects and advantages of the present invention will become apparent to those skilled in the art.

DETAILED DESCRIPTION OF THE PREFERRED EMBODIMENTS

Figure 1:
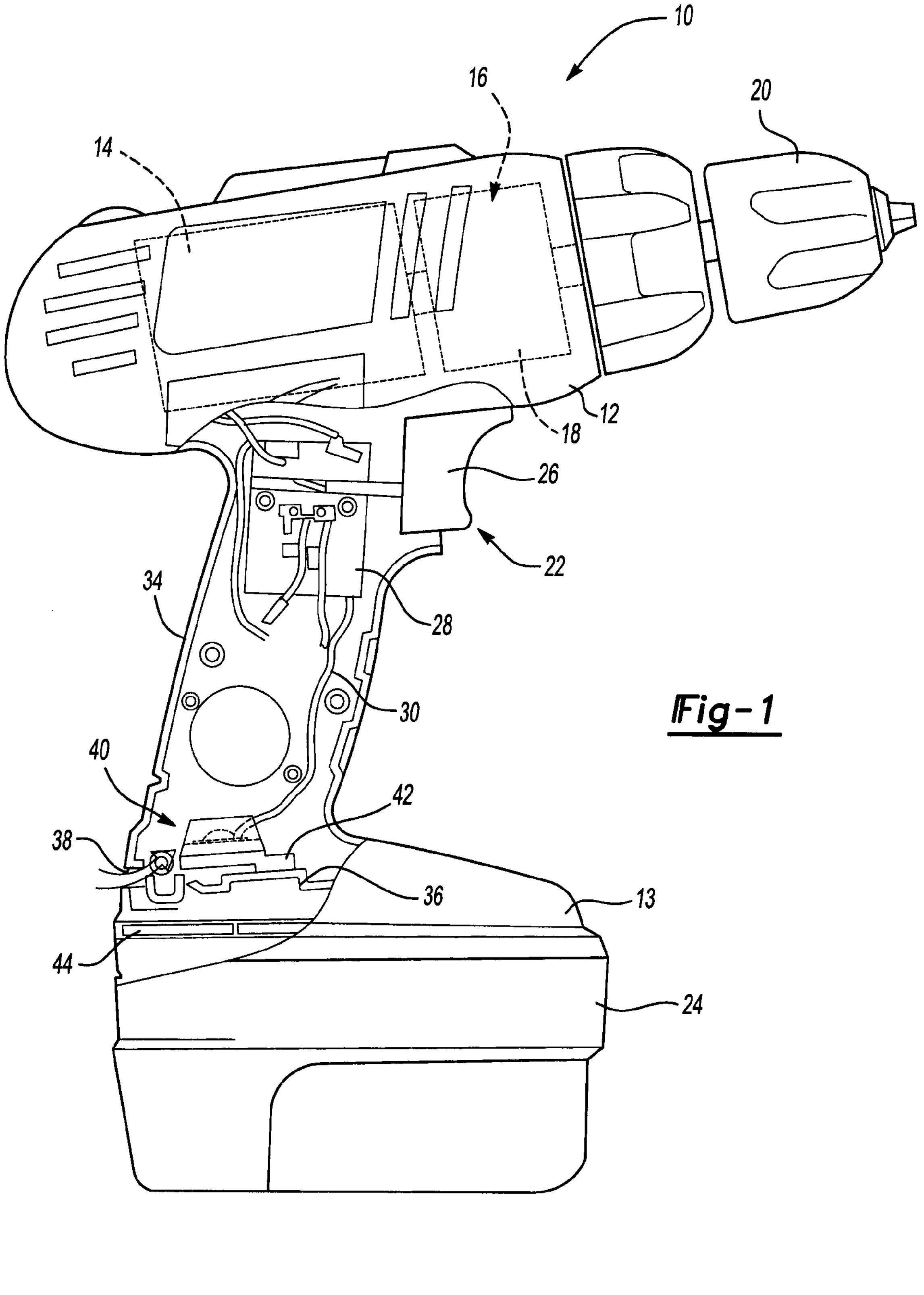
FIG. 1 is a plan view partially in section of a power tool in accordance with the present invention.
Figure 2:
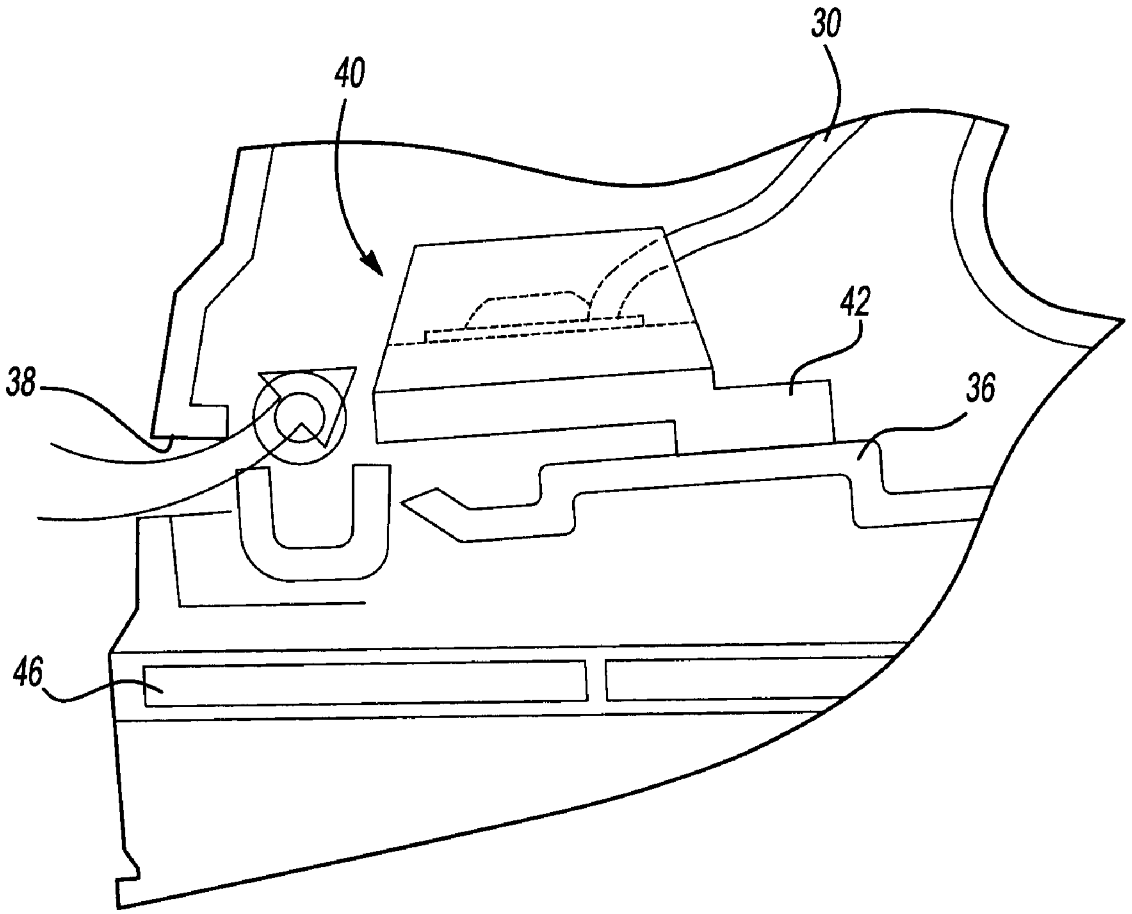
FIG. 2 is a partial cross-section view of the power tool of FIG. 1.
Figure 3:
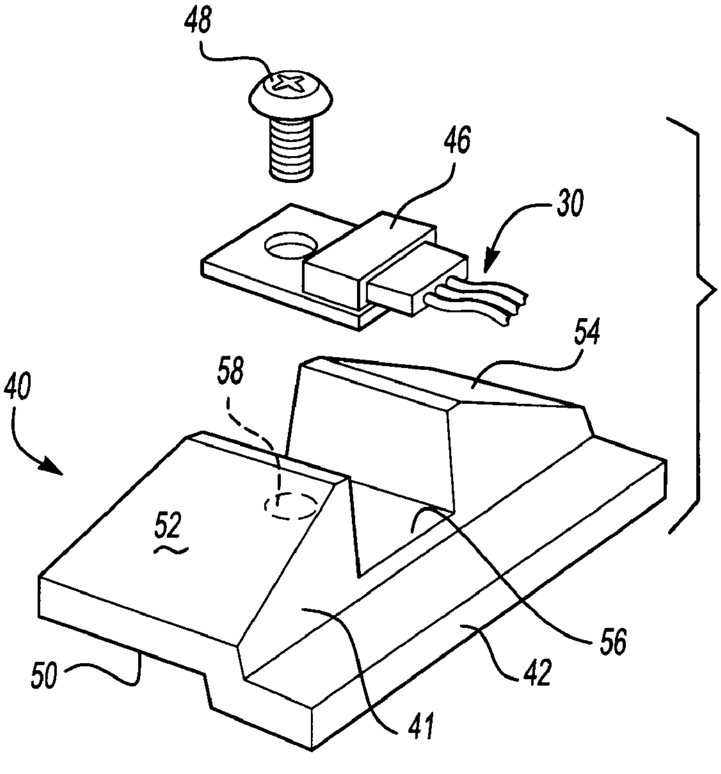
FIG. 3 is an enlarged perspective view of the heat sink of FIG. 1.
Figure 4:
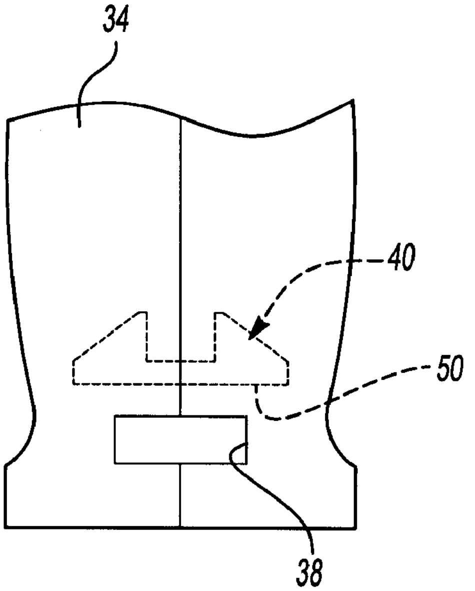
FIG. 4 is a plan view of the handle portion with the heat sink in phantom of FIG. 1.

Turning to the figures, a power tool is shown and designated with the reference numeral 10. Particularly, the power tool 10 is illustrated as a drill. The power tool 10 includes a housing 12, which is of a clam-shell design, to surround a motor 14 and an output 16, which includes a transmission 18. Also, a chuck 20 is coupled with the output to couple with a drill bit or tool (not shown). The drill includes an activation member 22 and a power source such as a battery 24.

The activation member 22 includes a trigger 26 and a switch housing 28. The trigger 22 is pushed inward which, in turn, activates the switch which, in turn, energizes the motor 14 to drive the output 16. Wires 30 are coupled with the switch housing 28. The wires 30 lead to a heat sink 40. The wires 30 conduct current from the switch assembly 32 to the field effect transistor 46 fastened to the heat sink 40. During operation, the field effect transistor 46 dissipates heat to the heat sink 40 and, in turn, to ambient. The field effect transistor includes a fastener 48 which secures the field effect transistor to the heat sink 40.

The heat sink 40 is positioned at the free end 13 of the housing handle portion 34. The heat sink 40 has an overall truncated conical tetrahedron shape with a pair of parallel side walls 41 and an extending tongue 42. The heat sink 40 is positioned adjacent the battery 24 on a shelf 36 in the housing 12. Also, the heat sink 40 is positioned adjacent to openings or gaps 38 in the housing which enable fresh air to pass through the housing, cooling the battery 24 as well as the heat sink 40. The heat sink 40 has a major planar base 50 with two minor sides 52, 54 angling from the major side 50. A second planar side 56, parallel to base 50, is recessed between the two minor sides 52, 54. The second planar side 56 includes an aperture 58 to receive fastener 48 to secure the wire 30.

The battery 24 includes a rail member 44 which is positioned into a receiving recess 46 of the housing handle portion. The battery is slid into the recess and secured onto the free end of the housing.

While the above detailed description describes the preferred embodiment of the present invention, the invention is susceptible to modification, variation and alteration without deviating from the scope and fair meaning of the subjoined claims.

What is claimed is:

1. A power tool, comprising:

a housing, said housing having a motor portion and a handle portion;

a motor in said housing;

an output coupled with said motor;

an activation member coupled with said motor, for energizing said motor for driving said output;

a power source coupled with the motor and said activation member;

a heat generating component coupled with said actuation member; and a heat sink coupled with said heat generating component and said heat sink discrete from said activation member, said heat sink portion positioned on a shelf in said handle portion of said housing near a bottom of said handle portion.

2. The power tool according to claim 1, wherein said power source being a battery.

3. The power tool according to claim 1, wherein said heat sink is remotely positioned away from said activation member.

4. The power tool according to claim 1, wherein the power tool being a drill.

5. A power tool, comprising:

a housing having a motor portion and a handle portion;

a motor in said housing;

an output coupled with said motor;

an activation member in said housing, said activation member coupled with said motor for energizing said motor for driving said output;

a battery coupled with said motor and said activation member, said battery supported on said housing adjacent said handle portion;

a heat generating component coupled with said actuation member; and a heat sink coupled with said heat generating component and said heat sink discrete from said activation member, said heat sink positioned on a shelf in said handle portion of said housing near the bottom of the housing near said battery.

6. The power tool according to claim 5, wherein said activation member being a switch.

7. The power tool according to claim 5, wherein said housing handle portion includes rails on its free end for receiving said battery.

8. The power tool according to claim 5, wherein said heat sink has an overall truncated conical tetrahedron shape.

9. The power tool according to claim 5, wherein said heat sink being positioned remote from said switch.

10. The power tool according to claim 5, wherein said handle portion of said housing includes openings for enabling cooling of said battery and said heat sink, said openings positioned adjacent said shelf.

11. The power tool according to claim 5, wherein said heat sink includes at least one large planar surface for dissipating heat.

* * * * *